(12) United States Patent
Wu et al.

(10) Patent No.: US 12,166,034 B2
(45) Date of Patent: Dec. 10, 2024

(54) SEMICONDUCTOR DEVICE WITH CPODE AND RELATED METHODS

(71) Applicant: Taiwan Semiconductor Manufacturing Company, Ltd., Hsin-Chu (TW)

(72) Inventors: Chi-Wei Wu, Hsinchu (TW); Hsin-Che Chiang, Taipei (TW); Chun-Sheng Liang, Changhua County (TW); Jeng-Ya Yeh, New Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 227 days.

(21) Appl. No.: 17/458,924

(22) Filed: Aug. 27, 2021

(65) Prior Publication Data
US 2023/0065498 A1 Mar. 2, 2023

(51) Int. Cl.
| | |
|---|---|
| *H01L 27/088* | (2006.01) |
| *B82Y 10/00* | (2011.01) |
| *H01L 21/8234* | (2006.01) |
| *H01L 29/06* | (2006.01) |
| *H01L 29/423* | (2006.01) |
| *H01L 29/66* | (2006.01) |
| *H01L 29/775* | (2006.01) |
| *H01L 29/786* | (2006.01) |

(52) U.S. Cl.
CPC .... *H01L 27/088* (2013.01); *H01L 21/823481* (2013.01); *H01L 27/0886* (2013.01); *H01L 21/823431* (2013.01)

(58) Field of Classification Search
CPC ..... H01L 21/76224–76237; H01L 21/823481; H01L 21/823878; H01L 29/0649–0653; H01L 27/088; H01L 27/0886; H01L 21/823431; H01L 29/42392; H01L 29/0847; H01L 29/785; H01L 29/66795; H01L 29/41791; H01L 29/7843; H01L 21/823418; H01L 29/7848; H01L 29/66553; H01L 21/76232; H01L 21/76; H01L 21/845; H01L 29/6656; H01L 21/31053; H01L 21/823821
See application file for complete search history.

(56) References Cited

U.S. PATENT DOCUMENTS

| | | | |
|---|---|---|---|
| 9,564,369 B1 * | 2/2017 | Kim | H01L 21/823437 |
| 10,128,240 B2 * | 11/2018 | Min | H01L 29/7848 |
| 10,325,819 B1 * | 6/2019 | Gao | H01L 21/823878 |
| 2010/0304548 A1 * | 12/2010 | Turner | H01L 21/76224 |
| | | | 257/E21.546 |

(Continued)

*Primary Examiner* — Sonya McCall-Shepard
(74) *Attorney, Agent, or Firm* — Haynes and Boone, LLP

(57) ABSTRACT

A semiconductor device includes a silicon substrate and a fin formed above the substrate. The fin provides active regions for two devices, such as gate-all-around transistors. The semiconductor device also includes a fin-insulating structure positioned to electrically isolate the active regions for the two devices. The fin-insulating structure is formed in a trench, with a first portion adjacent the fin and a second portion below the fin and extending into the substrate. The fin-insulating structure includes an oxide liner in the second portion of the trench, but not the first portion. The fin-insulating structure is further filled with an insulating material such as silicon nitride.

20 Claims, 11 Drawing Sheets

(56) References Cited

U.S. PATENT DOCUMENTS

| | | | |
|---|---|---|---|
| 2016/0111336 A1* | 4/2016 | Chang | H01L 27/0886 |
| | | | 438/430 |
| 2019/0229010 A1 | 7/2019 | Lin et al. | |
| 2020/0312709 A1 | 10/2020 | Lin et al. | |
| 2020/0343365 A1* | 10/2020 | Lin | H01L 29/165 |
| 2020/0343377 A1* | 10/2020 | Chiang | H01L 29/78696 |
| 2021/0036121 A1* | 2/2021 | Lim | H01L 29/78696 |
| 2021/0183855 A1 | 6/2021 | Ng et al. | |

\* cited by examiner

SEMICONDUCTOR DEVICE WITH CPODE AND RELATED METHODS

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced to improve gate control by increasing gate-channel coupling, reduce OFF-state current, and reduce short-channel effects. One such multi-gate device that has been introduced is the fin field-effect transistor (FinFET). The FinFET gets its name from the fin-like structure which extends from a substrate on which it is formed, and which is used to form the FET channel. Another multi-gate device, introduced in part to address performance challenges associated with FinFETs, is the gate-all-around (GAA) transistor. GAA transistors get their name from the gate structure which extends completely around the channel, providing better electrostatic control than prior FinFETs. FinFETs and GAA transistor devices are compatible with conventional complementary metal-oxide-semiconductor (CMOS) processes and their three-dimensional structure allows them to be aggressively scaled while maintaining gate control and mitigating SCEs.

To continue to provide the desired scaling and increased density for multi-gate devices in advanced technology nodes, continued reduction of the contacted poly pitch (CPP) (or "gate pitch") is necessary. In at least some existing implementations, a continuous poly on diffusion edge (CPODE) process is used for making a fin-insulating structure to isolate a fin into two separate regions. By way of example, a CPODE process may be used to isolate neighboring active regions (e.g., device regions including source, drain, and channel) on the fin. This fin-insulating structure has been successfully used to scale the CPP. However, in some cases such as in a shrinkage applied to a technology node, the corresponding shrinkage of the pitch of one or more source/drain features disposed next to a CPODE region may undesirably bridge or experience other desired tendencies. Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
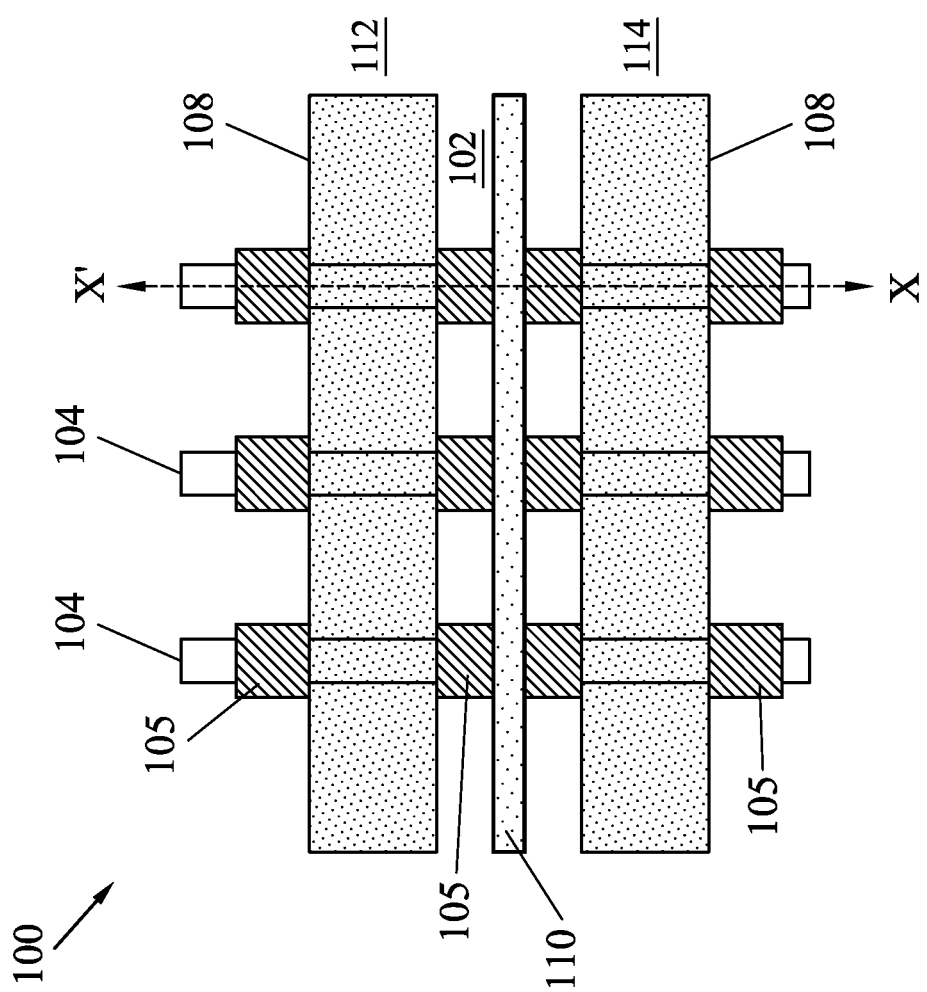
FIG. 1A illustrates a simplified top-down layout view of a multi-gate device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure presents embodiments in the form of multi-gate transistors. Multi-gate transistors include those transistors whose gate structures are formed on at least two-sides of a channel region. These multi-gate devices may include a P-type metal-oxide-semiconductor device or an N-type metal-oxide-semiconductor multi-gate device. Specific examples may be presented and referred to herein as FINFET, because of their fin-like structure. Also presented herein are embodiments of a type of multi-gate transistor referred to as a gate-all-around (GAA) device. A GAA transistor device includes any device that has its gate structure, or portion thereof, formed on 4-sides of a channel region (e.g., surrounding a portion of a channel region). Devices presented herein also include embodiments that have channel regions disposed in nanosheet channel(s), nanowire channel(s), bar-shaped channel(s), and/or other suitable channel configurations. Presented herein are embodiments of devices that may have one or more channel regions (e.g., nanowires/nanosheets) associated with a single, contiguous gate structure. However, one of ordinary skill would recognize that the teaching can apply to a single channel (e.g., single nanowire/nanosheet) or any number of channels. One of ordinary skill may recognize other examples of semiconductor devices that may benefit from aspects of the present disclosure.

Continuing to provide the desired scaling and increased density for multi-gate devices in advanced technology nodes calls for scaling of the contacted poly pitch (CPP) (or "gate pitch"). In at least some existing implementations, a continuous poly on diffusion edge (CPODE) process has been used to scale the CPP. For purposes of this disclosure, a "diffusion edge" may be equivalently referred to as an active edge, where for example an active edge abuts adjacent active regions. Further, an active region includes a region where transistor structures are formed (e.g., including source, drain, and gate/channel structures). In some examples, active regions may be disposed between insulating regions. The CPODE process may provide an isolation region between neighboring active regions, and thus neighboring transistors, by performing a dry etching process along an active edge (e.g., at a boundary of adjacent active regions) to form a cut region and filling the cut region with a dielectric, such as silicon nitride (SiN).

However, as overall spacing continues to decrease, difficulties can arise due to the CPODE etching process. For example, during the subsequent CPODE dry etching process to form the cut region along the active edge, the adjacent source/drain contacts (MD) may bridge the cut region, thereby inducing a short circuit. Thus, device performance and reliability of a transistor formed in the adjacent active region, using the shorted contacts (MDMD) will be degraded. Existing techniques have not proved entirely satisfactory in all respects.

FIGS. 1A-B, 5A-C, and 7A-B are diagrammatic views of a semiconductor device, in portion, according to some embodiments of the present disclosure. In some embodiments, the device may be included in a microprocessor, a memory, and/or other IC device. In some embodiments, the device is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), FinFET, nanosheet FETs, nanowire FETs, other types of multi-gate FETs, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, memory devices, other suitable components, or combinations thereof. The figures have been simplified for the sake of clarity to better understand the inventive concepts of the present disclosure. Additional features can be added in the device, and some of the features described below can be replaced, modified, or eliminated in other embodiments of the device.

For purposes of the discussion that follows, FIG. 1A provides a simplified top-down layout view of a semiconductor device 100. In the present embodiment, the semiconductor device 100 is a FinFET device, and includes multiple GAA transistors, or other type of devices. In this embodiment, the device is fabricated in and on a substrate 102. The substrate 102 includes silicon, such as common in a silicon wafer. Alternatively or additionally, substrate 102 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe); GaAsP, AlInAs, AlGaAs, GaInAs, GaInP, and/or GaInAsP; or combinations thereof. Alternatively, substrate 102 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

The semiconductor device 100 includes a plurality of fin type structures (fins) 104 extending from the substrate 102, gate structures 108 disposed over and around the fins 104, and source/drain regions 105, where the source/drain regions 105 are formed in, on, and/or surrounding the fins. Channel regions of the semiconductor device 100, which may include a plurality of semiconductor channel layers (e.g., when the semiconductor device 100 includes a GAA transistor), disposed within the fins 104, underlying the gate structure 108, along a plane substantially parallel to a plane defined by section XX' of FIG. 1A. A continuous poly on diffusion edge (CPODE) process for making a fin-insulating structure 110 is formed across the fins 104, dividing the device 100 into two different cells 112, 114. Various features of the semiconductor device 100, including the fin-insulating structure 110, are discussed in more detail below with reference to FIG. 1B. It is further understood that the descriptions, including quantity of features (e.g., number of fins 104, number of gate structures 108, etc.) are merely provided for the sake of example.

Figure 1B:
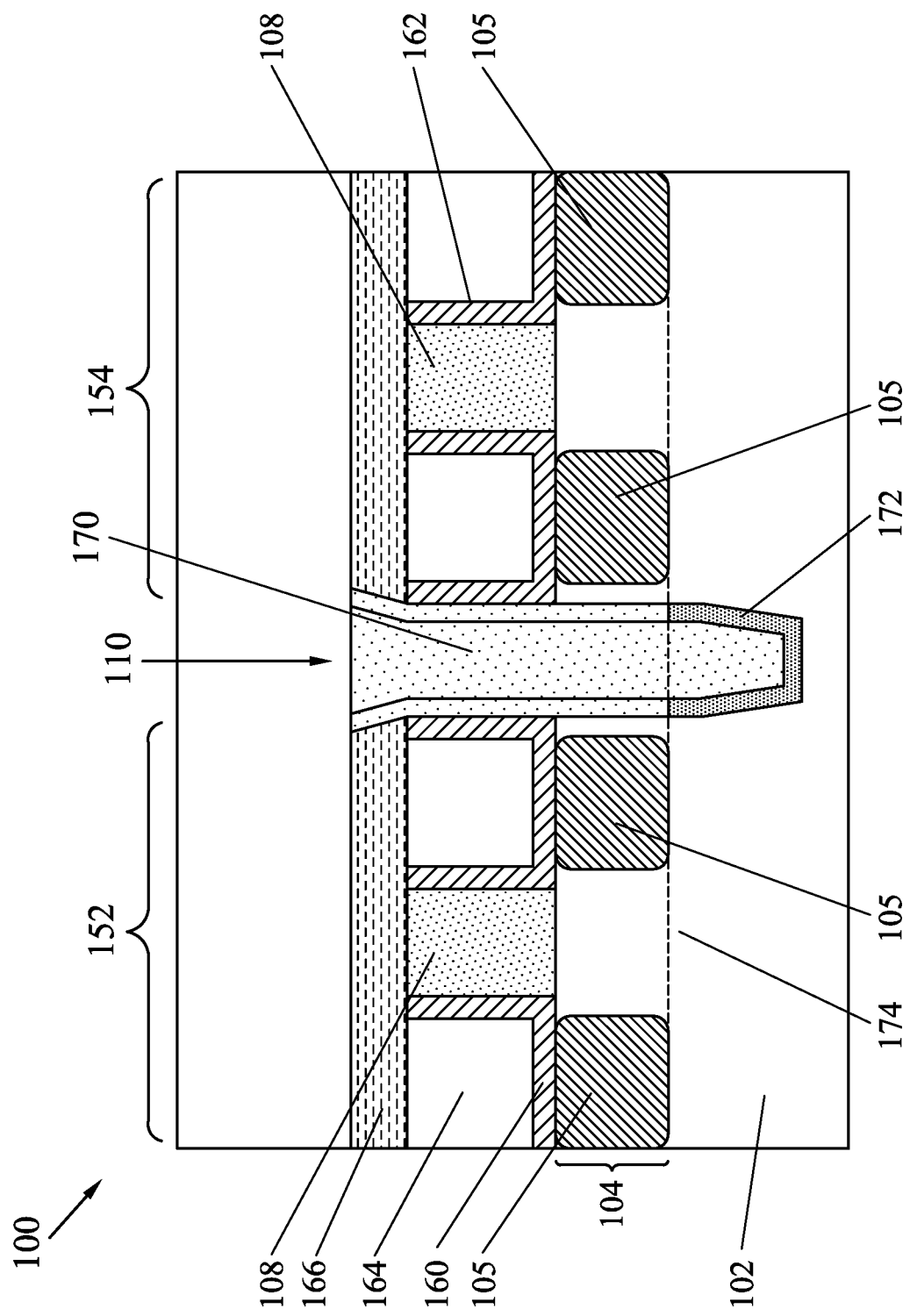
FIG. 1B is provides a cross-sectional view of the multi-gate device of FIG. 1A, along a cut line XX'.

FIG. 1B provides a cross-sectional view of the semiconductor device 100 of FIG. 1A, as seen along the plane defined by section XX'. From this view, one can see a cross-section of the fin 104 formed over the substrate 102. Two GAA transistors are formed in and on the fin 104, including a first transistor 152 and a second transistor 154. The first transistor 152 is formed in the first cell 112 (FIG. 1A), while the second transistor 154 is formed in the second cell 114 (also FIG. 1A). Each transistor 152, 154 includes a pair of source/drain regions 105 which can be formed in various manners, including by forming a trench in the fin 104 and epitaxially growing the source/drain regions 105 with a material such as epitaxial silicon or silicon germanium. Channel regions of the fin 104 are formed between each pair of source/drain regions 105. In the present example, the transistors 152, 154 are GAA transistors, and with the cross-sectional drawing of FIG. 1B, top portions of two gate structures 108 are shown above the fin 104, directly above the corresponding channel regions.

There are multiple insulating layers on, around, and above the fins 104 and substrate 102. A gate dielectric is provided between the fins 104 and the gate structures 108, such as a high-k dielectric for use with a metal gate. In the present embodiment, a first dielectric layer 160 is formed over the source/drain regions 105, and gate spacers 162 are formed on sidewalls of the gate structure 108. An interlayer dielectric (ILD) layer 164 is formed between the gate structures 108, above the first dielectric layer 160 and the between the gate spacers 162. Another insulating layer 166, such as silicon nitride, is formed above the interlayer dielectric 164 and over the gate structures 108 and the gate spacers 162.

The fin-insulating structure 110, which is formed by a CPODE process discussed further below, is positioned between the two transistors 152, 154 formed on the fin 104. The fin-insulating structure 110 electrically isolates the neighboring active regions (e.g., device regions including source, drain, and gate structures) of the two transistors 152, 154, and also helps to separate the two cells 112, 114 (FIG. 1A). In the present embodiment, the fin-insulating structure 110 is filled with a dielectric material such as silicon nitride (SiN) 170. An oxide liner 172, such as silicon oxide, is also included in the fin-insulating structure 110 at a lower portion of the feature. In the present embodiment, the oxide liner is formed below the fin 104, as represented by the dotted line 174 in FIG. 1B. In another embodiment, the oxide liner 172 is formed beginning at a lower midpoint of the source/drain regions and down towards the end of the fin-insulating structure 110.

Figure 2:
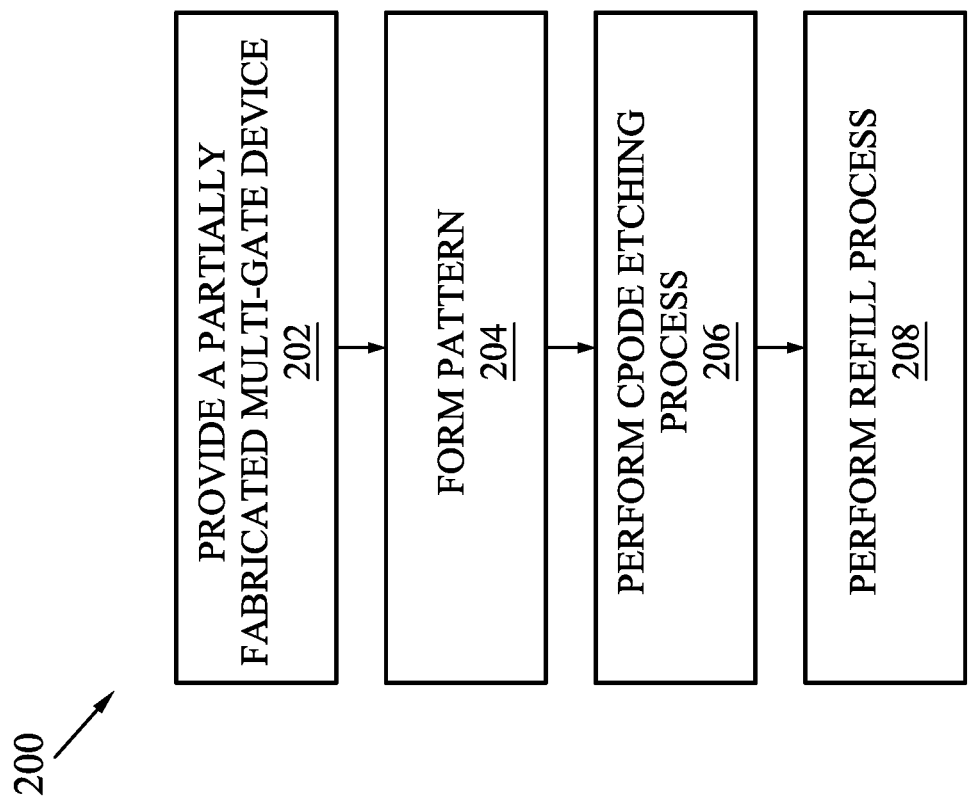
FIG. 2 is a flow chart of a method of fabricating a multi-gate device according to one or more aspects of the present disclosure.

Referring to FIG. 2, illustrated therein is a method 200 for fabricating a semiconductor device, such as but not limited to the device 100 of FIGS. 1A and 1B, using a CPODE process, in accordance with various embodiments. The method 200 is discussed below with reference to GAA transistors having a channel region that may be referred to as a nanosheet or nanowire, and which may include various geometries (e.g., cylindrical, bar-shaped) and dimensions. However, it will be understood that aspects of the method 200, including the disclosed CPODE process, may be equally applied to other types of multi-gate devices (e.g., such as FinFETs or devices including both GAA transistor devices and FinFETs) without departing from the scope of the present disclosure. In some embodiments, the method 200 may be used to fabricate the semiconductor device 100, described above with reference to FIGS. 1A and 1B. Thus, one or more aspects discussed above with reference to the semiconductor device 100 may also apply to the method 200. It is understood that the method 200 includes steps having features of a complementary metal-oxide-semiconductor (CMOS) technology process flow and thus, are only described briefly herein. Also, additional steps may be performed before, after, and/or during the method 200.

The method 200 is described below with reference to FIGS. 3, 4, and 5 which illustrate a semiconductor device 300 at various stages of fabrication according to the method 200. For the sake of simplicity and clarity, the semiconductor device 300 is configured similarly to the semiconductor device 100 of FIGS. 1A and 1B, although as will be apparent to one of ordinary skill in the art, many different configurations can be made according to this method.

Further, the semiconductor device 300 may include various other devices and features, such as other types of devices such as additional transistors, bipolar junction transistors, resistors, capacitors, inductors, diodes, fuses, static random-access memory (SRAM) and/or other logic circuits, etc., but is simplified for a better understanding of the inventive concepts of the present disclosure. In some embodiments, the semiconductor device 300 includes a plurality of semiconductor devices (e.g., transistors), including PFETs, NFETs, etc., which may be interconnected. Moreover, it is noted that the process steps of method 200, including any descriptions given with reference to the figures are merely exemplary and are not intended to be limiting beyond what is specifically recited in the claims that follow.

The method 200 begins at step 202 where a partially fabricated semiconductor device is provided. Referring to the example of FIG. 3, in an embodiment of step 202, the semiconductor device 300 includes a substrate 302 and a fin 304. In some embodiments, the substrate 302 may be a semiconductor substrate such as a silicon substrate. The substrate 302 may include various layers, including conductive or insulating layers formed on a semiconductor substrate. The substrate 302 may include various doping configurations depending on design requirements as is known in the art. The substrate 302 may also include other semiconductors such as germanium, silicon carbide (SiC), silicon germanium (SiGe), or diamond. Alternatively, the substrate 302 may include a compound semiconductor and/or an alloy semiconductor. Further, the substrate 302 may optionally include an epi layer, may be strained for performance enhancement, may include a silicon-on-insulator (SOI) structure, and/or have other suitable enhancement features.

The fin 304 may include nanosheet channel layers. In some embodiments, the nanosheet channel layers may include silicon (Si). However, in some embodiments, the nanosheet channel layers may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. By way of example, the nanosheet channel layers may be epitaxially grown by a molecular beam epitaxy (MBE) process, a metalorganic chemical vapor deposition (MOCVD) process, and/or other suitable epitaxial growth processes.

Figure 3:
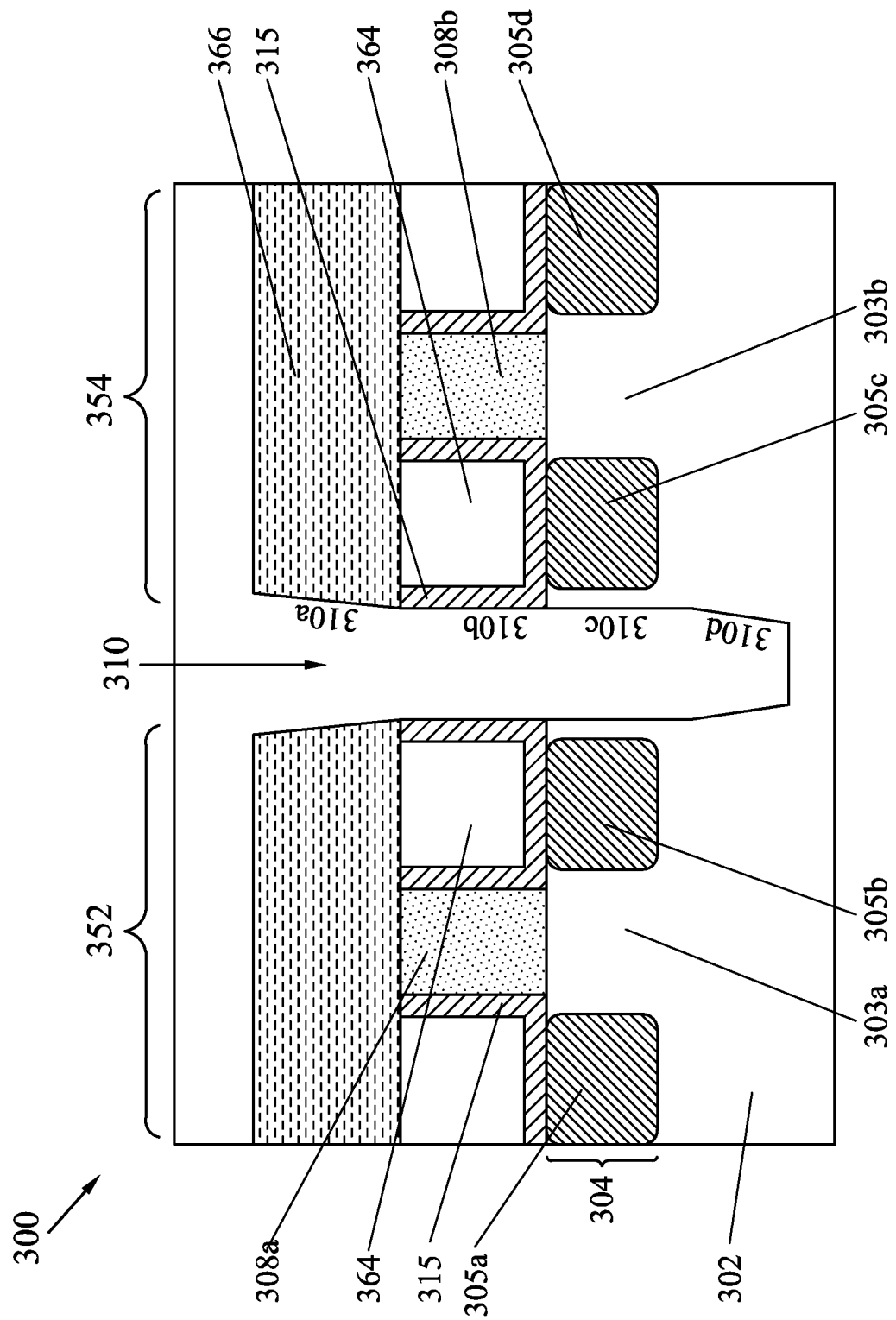
FIG. 3 provides a cross-sectional view of an embodiment of a semiconductor device 300, according to various stages of the method of FIG. 2.

It is noted that FIG. 3 shows that the fin 304 and a portion of the substrate 302 have a trench formed therein. This is the result of a CPODE process discussed below. A pair of GAA transistor devices 352, 354 are formed in and on the fin 304, such that the device 352 includes source/drain regions 305a, 305b surrounding a channel region 303a, and the device 354 includes source/drain regions 305c, 305d surrounding a channel region 303b. In accordance with embodiments of the present disclosure, the CPODE process provides an isolation region between the active region of the first GAA transistor device 352 and the active region of the second GAA transistor device 354. Shallow trench isolation (STI) features may also be formed interposing the fins 304. In some embodiments, the STI features include $SiO_2$, silicon nitride, silicon oxynitride, fluorine-doped silicate glass (FSG), a low-k dielectric, combinations thereof, and/or other suitable materials known in the art. In various examples, the dielectric layer used to form the STI features may be deposited by a CVD process, a sub atmospheric CVD (SACVD) process, a flowable CVD process, an ALD process, a PVD process, and/or other suitable process.

In various examples, the first GAA transistor device 352 includes a gate structure 308a and the second GAA transistor device 354 includes a gate structure 308b. In the present embodiments, the gate structures 308a, 308b form the gate associated with the multi-channels provided by the nanosheet channels in the channel region 303a, 303b of the first GAA transistor device 352 and the second GAA transistor device 354. The gate structures 308a, 308b may include an interfacial layer and a high-K gate dielectric layer formed over the interfacial layer. In some embodiments, the gate dielectric has a total thickness of about 1-5 nm. High-K gate dielectrics, as used and described herein, include dielectric materials having a high dielectric constant, for example, greater than that of thermal silicon oxide (~3.9).

In some embodiments, the interfacial layer may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. In some examples, the interfacial layer includes the chemical oxide layer, discussed above. The high-K gate dielectric layer may include a high-K dielectric material such as hafnium oxide ($HfO_2$).

Alternatively, the high-K gate dielectric layer may include other high-K dielectric materials, such as $TiO_2$, $HfZrO$, $Ta_2O_3$, $HfSiO_4$, $ZrO_2$, $ZrSiO_2$, $LaO$, $AlO$, $ZrO$, $TiO$, $Ta_2O_5$, $Y_2O_3$, $SrTiO_3$ (STO), $BaTiO_3$ (BTO), $BaZrO$, $HfZrO$, $HfLaO$, $HfSiO$, $LaSiO$, $AlSiO$, $HfTaO$, $HfTiO$, $(Ba,Sr)TiO_3$ (BST), $Al_2O_3$, $Si_3N_4$, oxynitrides (SiON), combinations thereof, or other suitable material. The high-K gate dielectric layer may be formed by ALD, physical vapor deposition (PVD), CVD, oxidation, and/or other suitable methods.

The gate structure may further include a metal gate having a metal layer formed over the gate dielectric. The metal layer may include a metal, metal alloy, or metal silicide. The metal layer may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the metal layer may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In various embodiments, the metal layer may be formed by ALD, PVD, CVD, e-beam evaporation, or other suitable process. Further, the metal layer may be formed separately for N-type and P-type transistors which may use different metal layers. In addition, the metal layer may provide an N-type or P-type work function, may serve as a transistor gate structure (electrode), and in at least some embodiments, the metal layer may include a polysilicon layer.

In some embodiments, a spacer (or barrier) layer 315 may be formed on sidewalls of a top portion of the gate structures 308a, 308b of each of the first GAA transistor device 352 and the second GAA transistor device 354. The spacer layer 315 may be formed prior to formation of the high-K/metal gate stack of the gate structure. For example, in some cases, the spacer layer 315 may be formed on sidewalls of a previously formed dummy (sacrificial) gate stack that is removed and replaced by the high-K/metal gate stack, described above, as part of a replacement gate (gate-last) process. In some cases, the spacer layer 315 may have a thickness of about 2-10 nm. In various embodiments, the thickness of the spacer layer 315 may be selected to provide a desired sidewall profile following a subsequent CPODE dry etching process, as discussed in more detail below. In some examples, the spacer layer 315 may include a dielectric material such as silicon oxide, silicon nitride, silicon carbide, silicon oxynitride, SiCN, silicon oxycarbide, SiOCN, SiOHCN, a low-K material (e.g., with a dielectric constant 'k'<7), and/or combinations thereof. In some embodiments, the spacer layer 315 includes multiple layers, such as main spacer layers, liner layers, and the like.

In various examples, the source/drain regions 305 include semiconductor epi layers such as Ge, Si, GaAs, AlGaAs, SiGe, GaAsP, SiP, or other suitable material, which may be formed by one or more epitaxial processes. In some embodiments, the source/drain regions 305 may be in-situ doped during the epi process. For example, in some embodiments, epitaxially grown SiGe source/drain features may be doped with boron. In some cases, epitaxially grown Si source/drain features may be doped with carbon to form Si:C source/drain features, phosphorous to form Si:P source/drain features, or both carbon and phosphorous to form SiCP source/drain features. In some embodiments, the source/drain regions 305 are not in-situ doped, and instead an implantation process is performed to dope the source/drain regions 305. In some embodiments, formation of the source/drain features may be performed in separate processing sequences for each of N-type and P-type source/drain features.

An inter-layer dielectric (ILD) layer 364 may also be formed over the device 300. In some embodiments, the ILD layer 364 includes materials such as tetraethylorthosilicate (TEOS) oxide, un-doped silicate glass, or doped silicon oxide such as borophosphosilicate glass (BPSG), FSG, phosphosilicate glass (PSG), boron doped silicon glass (BSG), and/or other suitable dielectric materials. The ILD layer 364 may be deposited by a PECVD process or other suitable deposition technique. In subsequent process steps, a contact is formed through the ILD layer 364 and through the spacer (or barrier) layer 315 to interconnect the corresponding source or drain region 105 to other circuitry.

The method 200 then proceeds to step 204 where a pattern is formed on the device. In some embodiments, the pattern is in the form of a hard mask layer 366 formed over the ILD layer 364. In the present embodiments, the hard mask layer 366 includes silicon nitride (SiN). As known in the art, the hard mask layer 366 is patterned, such as through a photoresist and photolithography process, to form an opening therein. In various embodiments, the patterning process used to form the hard mask layer 366 may also include steps such as soft baking, mask aligning, exposure, post-exposure baking, developing, rinsing, drying (e.g., spin-drying and/or hard baking), other suitable lithography processes, and/or combinations thereof. FIG. 3 shows an opening portion 310a through the hard mask layer 366 thereby forming a patterned hard mask. The figure shows an extended trench 310, but at this stage of the method 200, only the opening portion 310a in the hard mask layer 366 exists, and the rest of the trench 310 is formed at the next step and filled to form a fin-insulating structure.

The method 200 then proceeds to step 206 where a CPODE etching process is performed. The CPODE etching process can be used for etching materials such as polysilicon on the device 300, and for cutting the fin 304, and is sometimes referred to as a fin-cut process. With reference to FIG. 3, in an embodiment of step 206, the CPODE etching process etches the device 300 through the opening in the hard mask layer 366 to form the trench 310. In the present embodiment, the CPODE etching process uses a dry etching process, although other etching processes may be used. In some embodiments, the CPODE etching process etches through the opening portion 310a of the hard mask layer 366, etches an opening portion 310b through the ILD layer 364 and/or spacer layer 315, etches an opening portion 310c in the fin 304, and etches an opening portion 310d in the underlying substrate 302. It is understood that the trench 310 cuts the fin 304 into two separate portions, both of which are still collectively referred to as the fin 304.

The method 200 then performs a refill process 208 to form a fin-isolation structure. Different embodiments of the refill process are described below with respect to method FIG. 4, and corresponding cross-sectional views of a semiconductor device 300 shown in FIGS. 5A, 5B, and 5C. Additional embodiments of the refill process are described below with respect to FIG. 6, and corresponding cross-sectional views of the semiconductor device 300 shown in FIGS. 7A and 7B. The semiconductor devices of FIGS. 5A-C and 7A-B represent different embodiments of the semiconductor device 300 of FIG. 3, at further stages of processing.

Figure 4:
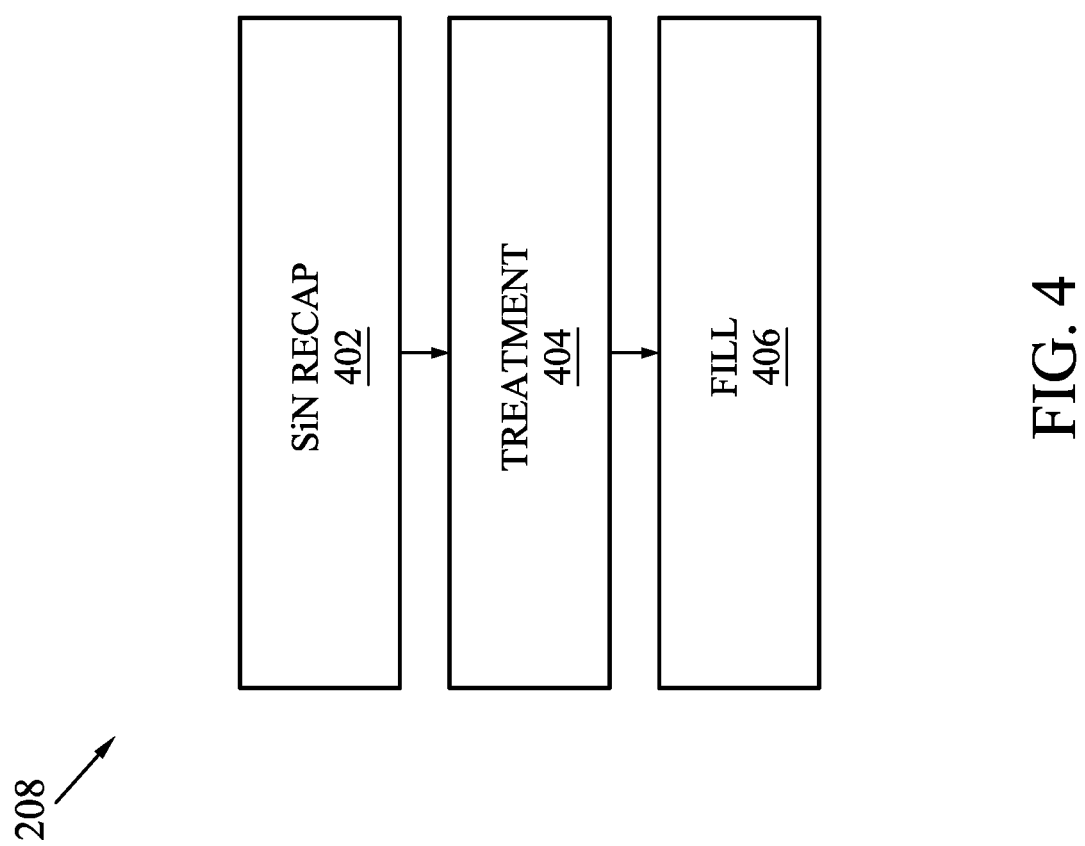
FIGS. 4 and 6 are flow charts of alternative embodiments of one of the steps of the method of FIG. 2.
Figure 5A:
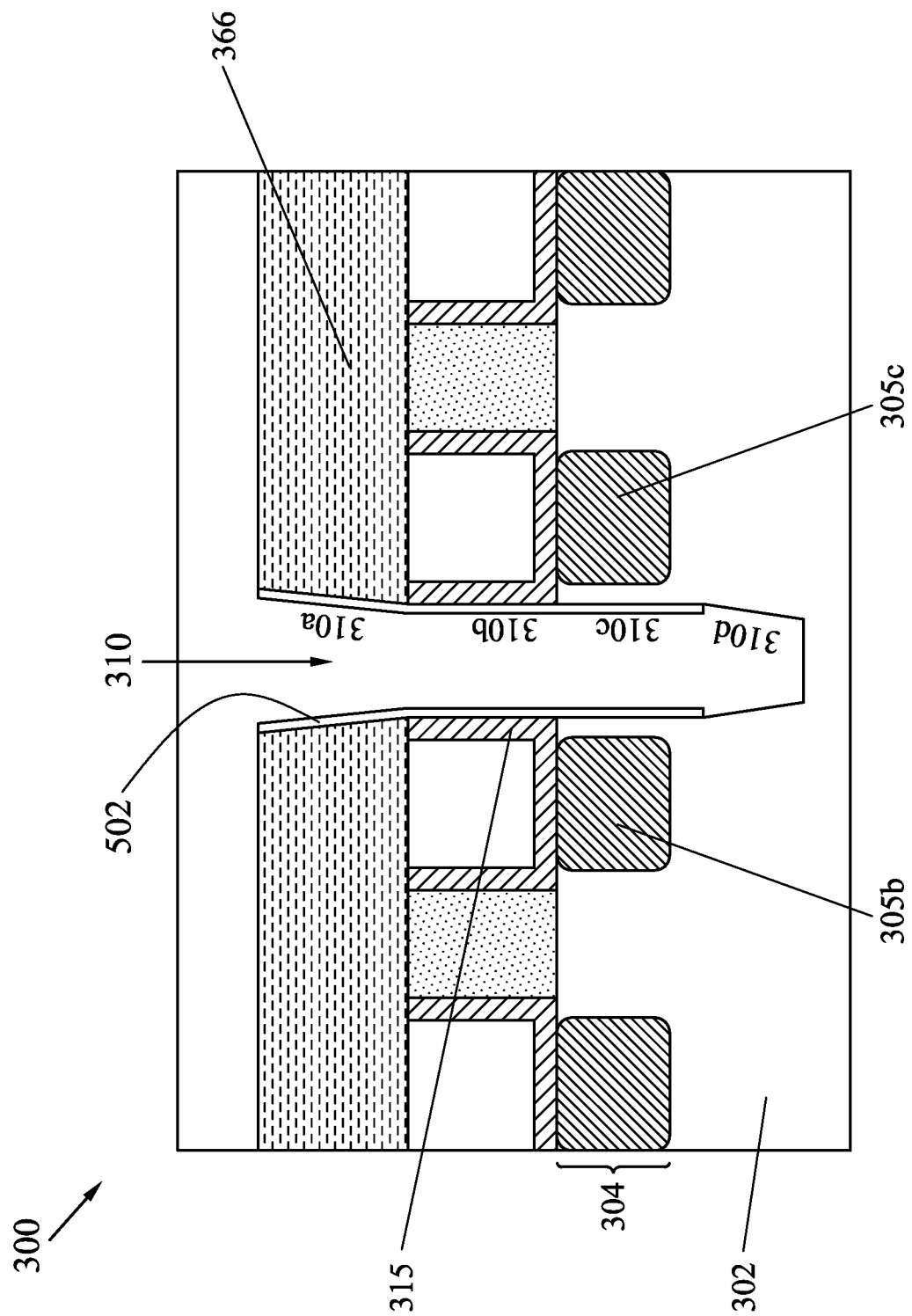
FIGS. 5A, 5B, and 5C provide cross-sectional views of an embodiment of the semiconductor device 300, according to various stages of the method of FIG. 4.
Figure 5B:
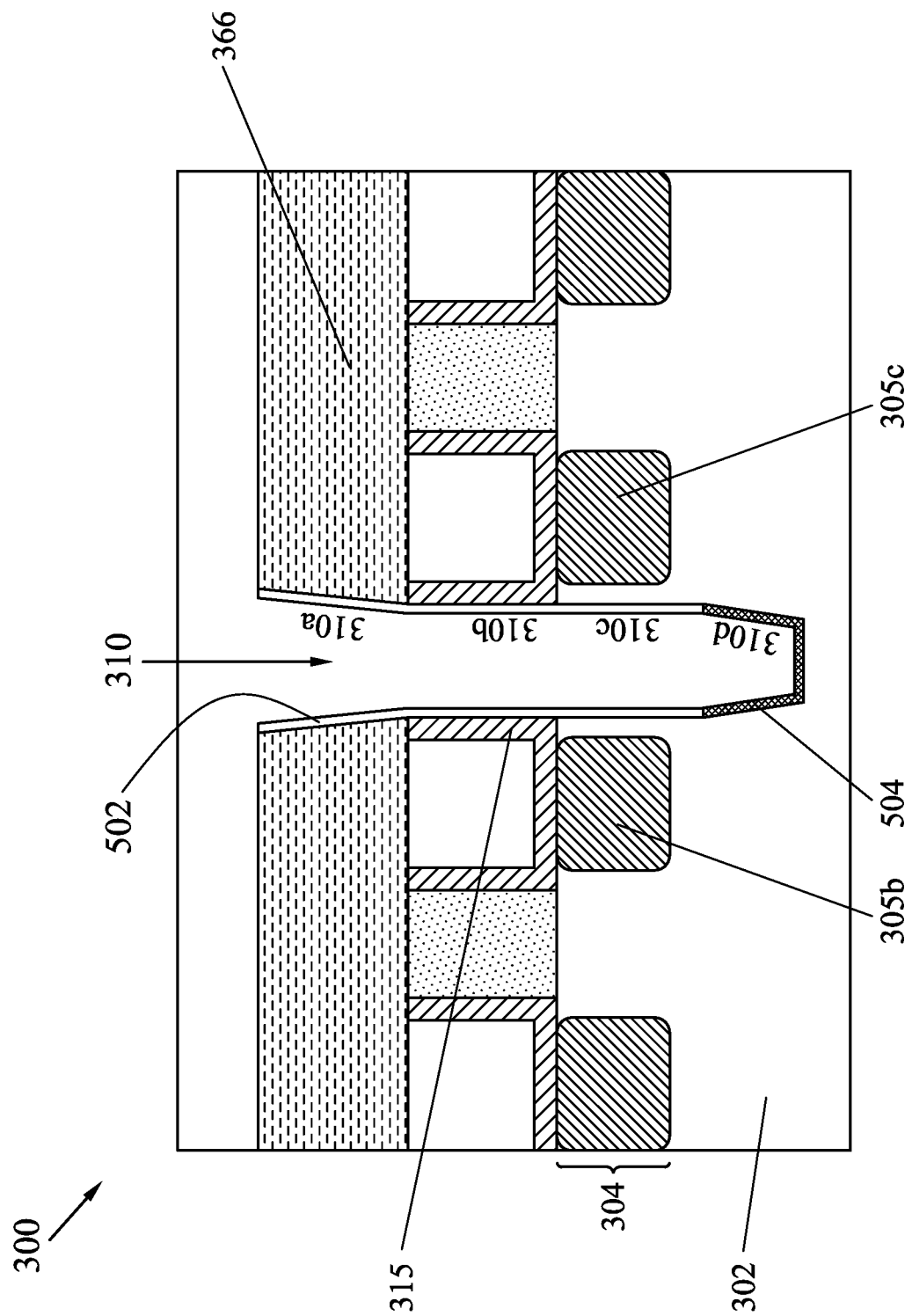
Figure 5C:
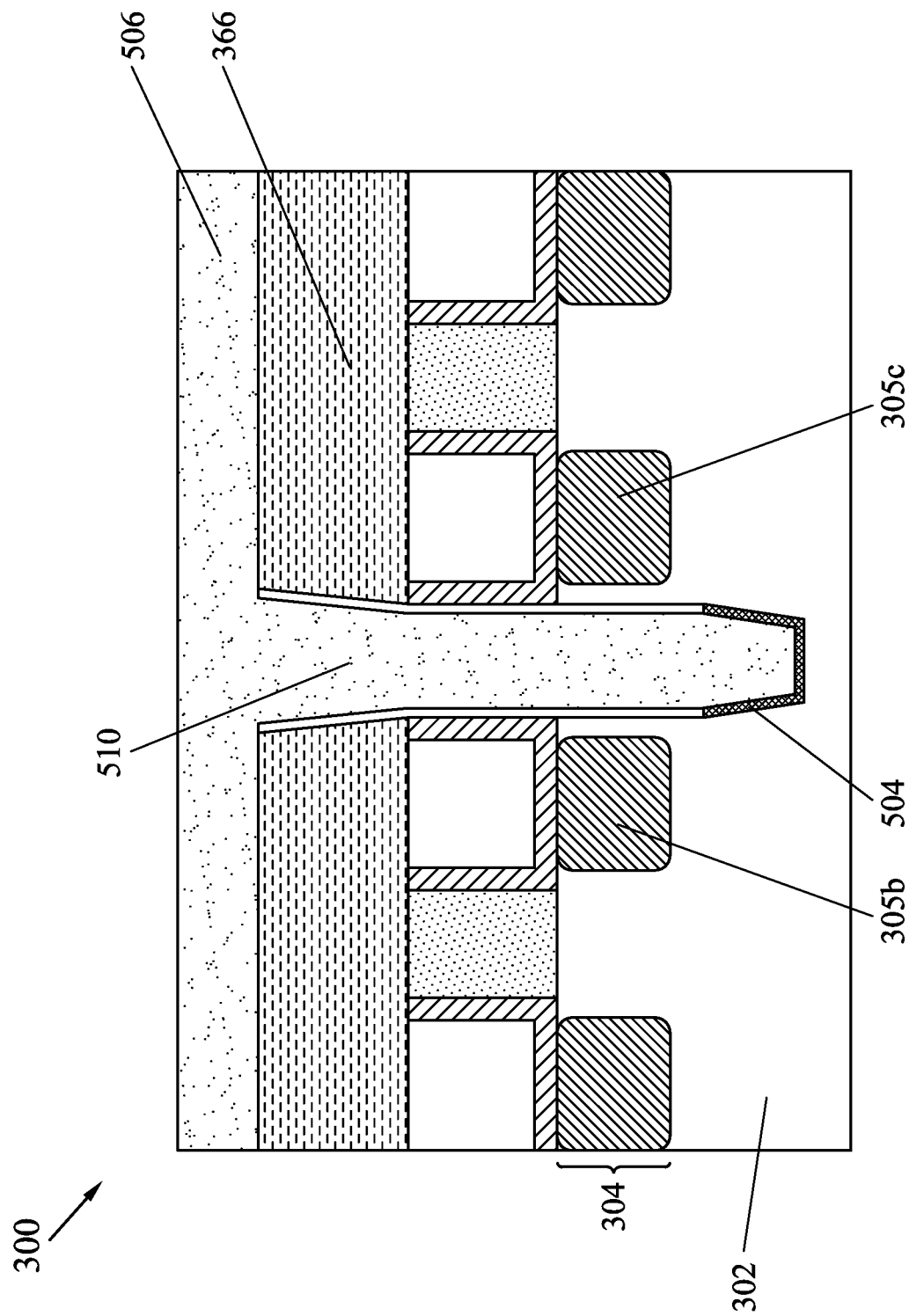

Referring to FIG. 4, in some embodiments, the refill process 208 (of FIG. 2) begins at step 402 by performing a silicon nitride (SiN) recap process. Examples of a semiconductor device in various stages of the refill process 208 of FIG. 4 are shown in FIGS. 5A-5C. Referring to the semiconductor device 300 of FIG. 5A, the SiN recap process 402 forms a layer of SiN 502 on the upper outer surfaces of the trench 310. In one example, the SiN layer 502 is formed on the surfaces of opening portions 310a, 310b, and 310c of the trench. It is noted that the SiN layer 502 is not on the bottom surface of the trench 310, such as at the surface of opening portion 310d. In the present embodiments, the thickness of the SiN layer 502 would be above 1 nm, and preferably between about 2 to 3 nm. Also, it is understood that the transition from having the SiN layer 502 to no layer on the trench surface can be at various locations on the trench sidewalls, and may be an abrupt transition or a graded transition. The SiN recap process 402 (after fin removal) can be performed by various known processes, such as depositing a layer of SiN by chemical vapor deposition or atomic layer deposition on the entire surface of the trench 310 and then removing the bottom portion of the layer at or around the opening portion 310d by a dry etch or plasma etch.

The refill process 208 then proceeds to step 404 where a treatment is performed on the device 300. Referring to the semiconductor device 300 of FIG. 5B, the treatment step 404 forms an oxide layer 504 on the lower outer surfaces of the trench 310. In one example, the oxide layer 504 is a silicon oxide layer formed on the surface of opening portion 310d of the trench. It is noted that the oxide layer 504 is not on the upper surfaces of the trench 310, such as at surfaces of opening portions 310a-c. In the present embodiments, the thickness of the oxide layer 504 would be above 1 nm, and preferably between about 2 to 3 nm. Also, it is understood that the transition from having the SiN layer 502 to the oxide layer 504 on the trench surface can be at various locations on the trench sidewalls, and may be an abrupt transition or a graded transition. The treatment process 404 can be performed by various known processes, such as a cleaning process for impurity removal and then dissolved Ozone treatment. Since the substrate 302 is silicon in the present embodiment, the treatment process 404 oxidizes the silicon thereby forming silicon oxide, such as SiO2.

The refill process 208 then proceeds to step 406 where the trench is filled. Referring to the semiconductor device 300 of FIG. 5C, in one embodiment, the trench 310 is filled with SiN 506. In another embodiment, the trench 310 is filled with dense SiN (high density nitrogen, or DSiN). In yet another embodiment, the trench 310 is filled with permutations of DSiN and SiN. For example, CVD of the DSiN can be done first, followed by CVD of SiN. Other embodiments include SiN+DSiN or DSiN+SiN+DSiN and so forth. In yet other embodiments, the fill process can use various chemical compositions with insulative properties, such as SiCN, SiOCN, SiC and so forth. As a result, the trench 310 is filled to form a fin-isolation structure 510. The total refill thickness in the present embodiment is greater than 35 nm, which assists in avoiding the merging of adjacent structures, such as contacts in the adjacent source/drain regions 305b and 305c.

Figure 6:
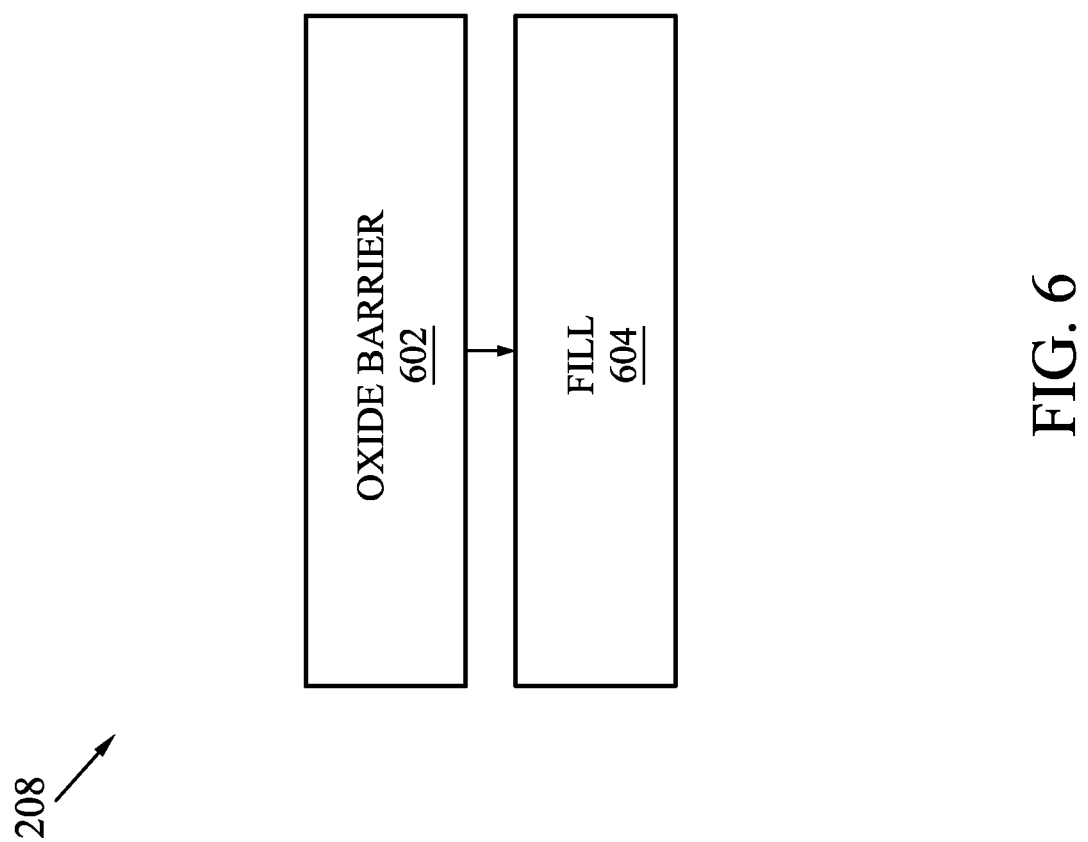
Figure 7A:
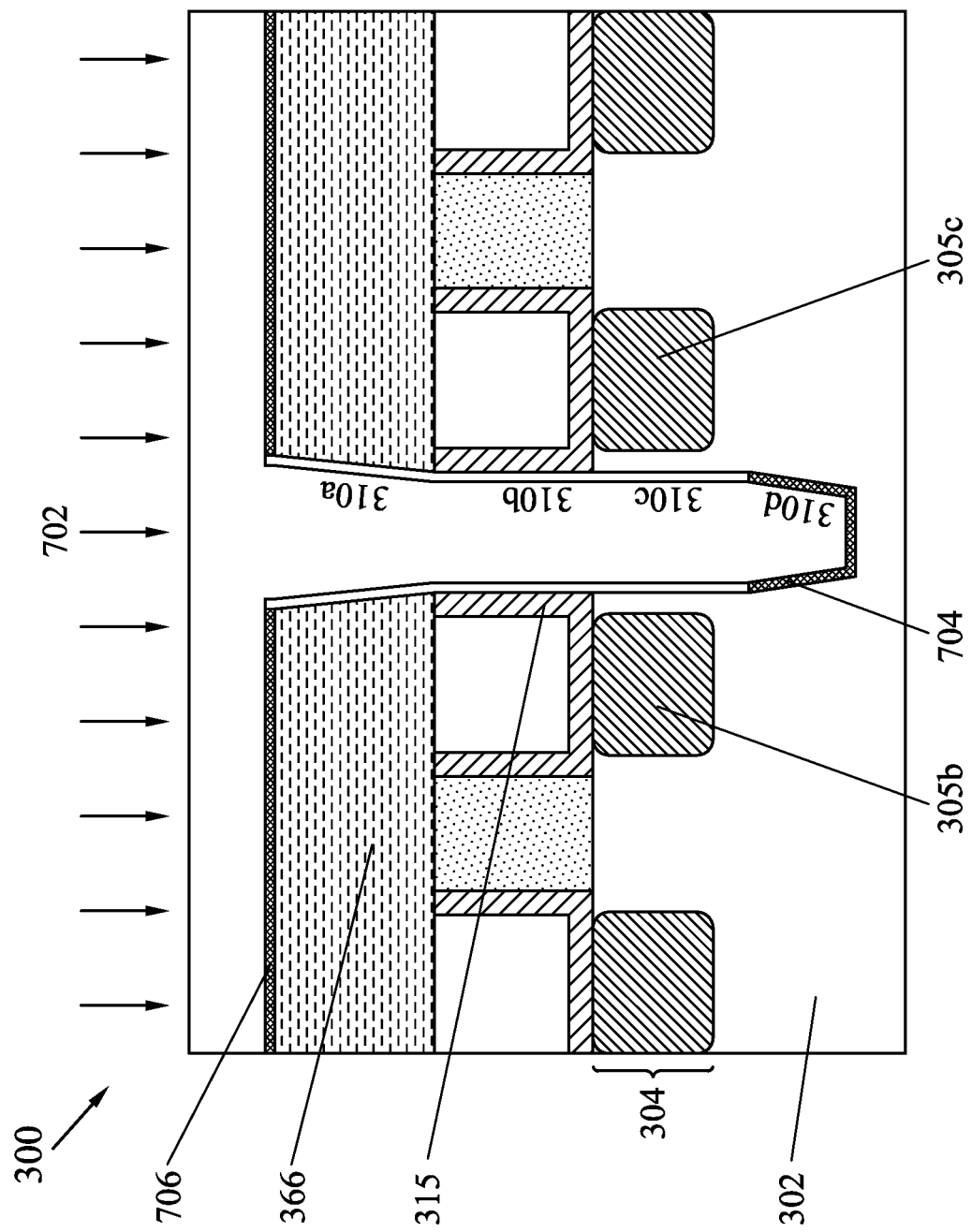
FIGS. 7A and 7B provide cross-sectional views of an embodiment of the semiconductor device 300, according to various stages of the method of FIG. 6.
Figure 7B:
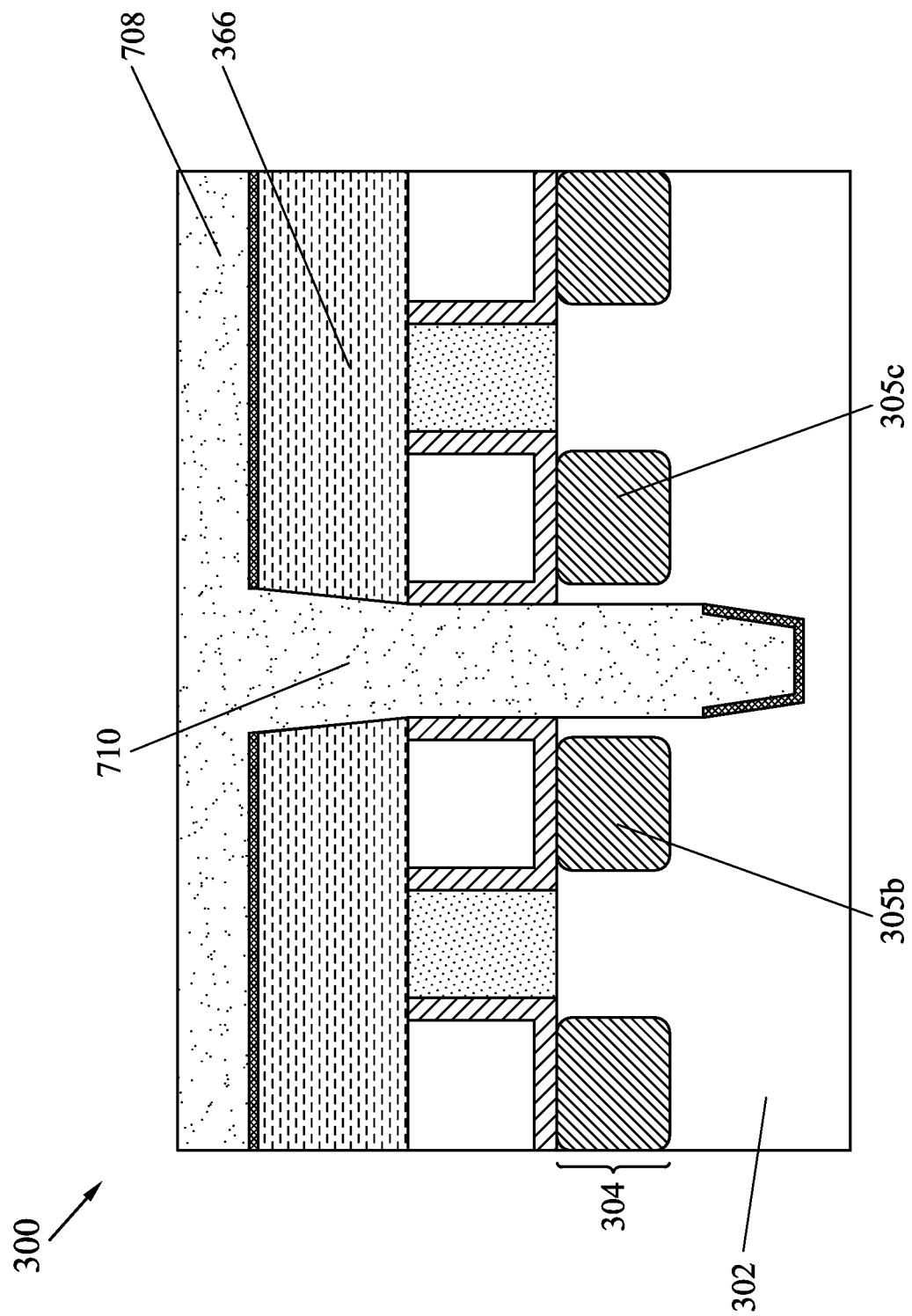

Referring to FIG. 8, in other embodiments, the refill process 208 (of FIG. 2) begins at step 602 by performing an oxide barrier process. Examples of various stages of the refill process 208 of FIG. 6 are shown in FIGS. 7A-7B. Referring to the semiconductor device 300 of FIG. 7A, in one example, the oxide barrier step 602 performs two processes, an oxide refill and an implantation 702 to form an oxide layer 704 at the bottom surface of opening portion 310d of the trench 310. It is noted that there is also an oxide layer 706 formed on the top surface of the hard mask layer 366. In the present embodiment, the oxide refill is performed using thermal oxidation, and the implantation 702 is an N-type implantation process. In the present embodiments, the thickness of the oxide layer 704 would be above 1 nm, and preferably between about 2 to 3 nm. Since the substrate 302 is silicon in the present embodiment, the oxide refill process oxidizes the silicon thereby forming silicon oxide, such as SiO2, with some of the dopants from the implantation process. In some embodiments, a cleaning process can be performed after the implantation process 702. In the present embodiment, the device 600 is cleaned using a fluorine-containing solvent is used, such as HF.

The refill process 208 then proceeds to step 604 where the trench is filled. Referring to the semiconductor device 300 of FIG. 7B, in one embodiment, the trench 310 is filled with SiN. In another embodiment, the trench is filled with dense SiN (high density nitrogen, or DSiN). In yet another embodiment, the trench is filled with permutations of DSiN and SiN. For example, CVD of the DSiN can be done first, followed by CVD of SiN. Other embodiments include SiN+DSiN or DSiN+SiN+DSiN and so forth. In yet other embodiments, the fill process can use various chemical compositions with insulative properties, such as SiCN, SiOCN, SiC and so forth. As a result, the trench 310 is filled to form a fin-isolation structure 710.

Generally, the semiconductor device 300 may undergo further processing to form various features and regions known in the art. For example, subsequent processing may form contact openings, contact metal, as well as various contacts/vias/lines and multilayer interconnect features (e.g., metal layers and interlayer dielectrics) on the gate structure (electrode), source and drain regions, configured to connect the various features to form a functional circuit that may include one or more semiconductor devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 200, and some process steps described above may be replaced or eliminated in accordance with various embodiments of the method 200. Further, while the method 200 has been shown and described as including the device 300 having a GAA transistor device, it will be understood that other device configurations are possible. In some embodiments, the method 200 may be used to fabricate FinFET devices or other multi-gate devices.

With respect to the description provided herein, disclosed are structures and related methods for performing a semiconductor device. In one embodiment, a semiconductor device includes a substrate including silicon and a fin formed above the substrate. The fin provides active regions for two (or more) devices, such as gate-all-around transistors. The semiconductor device also includes a fin-insulating structure positioned to electrically isolate the active regions for the two devices. The fin-insulating structure is formed in a trench, with a first portion adjacent the fin and a second portion below the fin and extending into the substrate. The fin-insulating structure includes an oxide liner in the second portion of the trench, but not the first portion. The fin-insulating structure is further filled with an insulating material such as silicon nitride.

In another embodiment, the semiconductor device includes a substrate including silicon and a fin formed above the substrate. A dielectric layer is provided above the fin and the substrate. The semiconductor device also includes a fin-insulating structure formed through the dielectric layer, through the fin thereby cutting the fin, and into the substrate. A first portion of the fin-insulating structure extending into the substrate includes an oxide liner, and a second, different portion of the fin does not include the oxide liner.

In one embodiment, the method includes providing a substrate including silicon and forming a fin above the substrate, the fin providing active regions for two (or more) devices such as gate-all-around transistors. The method further includes forming a dielectric layer above the fin and the substrate and cutting a trench in the dielectric layer, the fin, and a portion of the substrate. An oxide liner is formed on a portion of the trench proximate to the substrate and the trench with the oxide liner is filled with an insulating material such as silicon nitride.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate including silicon; and
a fin formed above the substrate and providing active regions for two devices, wherein the fin extends in a first direction in a top view;
a first gate structure and a second gate structure formed over the fin, wherein the first gate structure and the second gate structure extend in a second direction in the top view, the second direction perpendicular to the first direction; and
a fin-insulating structure positioned to electrically isolate the active regions for the two devices, wherein the fin-insulating structure is disposed between the first gate structure and the second gate structure in the top view, the fin-insulating structure having a length extending in the second direction in the top view, and a width extending in the first direction wherein the width extends from a first source/drain feature adjacent the first gate structure to a second source/drain feature adjacent the second gate structure in the top view, wherein the first source/drain feature is disposed between the first gate structure and the fin-insulating structure in the top view and the second source/drain feature is disposed between the second gate structure and the fin-insulating structure in the top view;
wherein the fin-insulating structure has a bottom region within the substrate and a top region disposed above an upper surface of the fin, the fin-insulating structure including an oxide liner in the bottom region, but not the top region, and further filled with an insulating material in the top region and including the insulating material on the oxide liner in the bottom region, wherein in a cross-sectional view an uppermost surface of the oxide liner is coplanar with or lower than a lower surface of the first source/drain feature.

2. The semiconductor device of claim 1, wherein the two devices are fin-type field effect transistors (FinFETs).

3. The semiconductor device of claim 2, wherein the two devices are gate-all-around (GAA) FinFETs.

4. The semiconductor device of claim 1, further comprising:
a dielectric layer above the first source/drain feature, wherein the fin-insulating structure extends through the dielectric layer, and an edge of the dielectric layer interfaces the insulating material of the top region of the fin-insulating structure.

5. The semiconductor device of claim 1, wherein the insulating material of the fin-insulating structure includes silicon nitride (SiN).

6. The semiconductor device of claim 1, wherein the insulating material of the fin-insulating structure includes dense silicon nitride (DSIN).

7. The semiconductor device of claim 1, wherein the insulating material of the fin-insulating structure includes a combination of SiN and another material.

8. The semiconductor device of claim 1, wherein the insulating material of the fin-insulating structure includes at least one from a group consisting of SiN, DSIN, SiCN, SiOCN, and SiC.

9. A semiconductor device, comprising:
a first gate structure and a second gate structure formed over a fin formed on a substrate;
a source/drain region adjacent the first gate structure;
a dielectric layer above the fin and the substrate and over the source/drain region; and
a fin-insulating structure formed through the dielectric layer, through the fin thereby cutting the fin, and into the substrate below the fin, wherein the fin-insulating structure includes a lower region, a middle region, and an upper region, the lower region of the fin-insulating structure is within the substrate and includes an oxide liner and a dielectric fill on the oxide liner, wherein the oxide liner has a tapered sidewall, the middle region of the fin-insulating structure is within the fin and is free of the oxide liner, and the upper region of the fin-insulating structure is within the dielectric layer, wherein the dielectric layer contiguously extends from a sidewall of the first gate structure, over the source/drain region, and interfacing a sidewall of the upper region of the fin-insulating structure, wherein the source/drain region is disposed between the first gate structure and the fin-insulating structure.

10. The semiconductor device of claim 9, wherein the dielectric fill is dense silicon nitride (DSiN) or silicon nitride (SiN).

11. The semiconductor device of claim 9, wherein the dielectric fill is a material selected from a group consisting of SiN, DSIN, SiCN, SiOCN, and SiC.

12. A semiconductor device, comprising:
a substrate including silicon having an active region extending above the substrate;
a dielectric layer above the active region; and
an insulating structure extending through the dielectric layer, wherein the insulating structure includes:
an oxide liner on a portion of the insulating structure, the oxide liner interfaces a first portion of a sidewall of the substrate, wherein the first portion of the sidewall is tapered; and
an insulating material over the oxide liner, wherein the insulating material interfaces a second portion of the sidewall of the substrate over the first portion wherein the oxide liner has an uppermost surface coplanar with a source/drain feature disposed in the substrate.

13. The semiconductor device of claim 12, wherein the uppermost surface is coplanar with a bottom most surface of the source/drain feature disposed in the substrate.

14. The semiconductor device of claim 12, wherein the second portion of the sidewall is tapered.

15. The semiconductor device of claim 12 further comprising:
   two source/drain features in the active region, wherein the source/drain features are on either side of the insulating structure when viewed in a cross-sectional cut through the source/drain features.

16. The semiconductor device of claim 4, wherein the dielectric layer includes a gate spacer layer contiguously extending from the top region of the fin-insulating structure and over the first source/drain feature to a sidewall of the first gate structure.

17. The semiconductor device of claim 1, wherein in the cross-sectional view the uppermost surface of the oxide liner is lower than the lower surface of the first source/drain feature.

18. The semiconductor device of claim 9, wherein the oxide liner has an uppermost surface coplanar with a lower surface of the source/drain region.

19. The semiconductor device of claim 1, wherein a region of the fin extends from the first source/drain feature to a sidewall of the fin-insulating structure.

20. The semiconductor device of claim 9, wherein the middle region of the fin-insulating structure within the fin and free of the oxide liner has an uppermost point below an upper surface of the source/drain region.

\* \* \* \* \*